United States Patent
Fan

(10) Patent No.: US 9,977,277 B2
(45) Date of Patent: May 22, 2018

(54) LIQUID CRYSTAL PANELS AND LIQUID CRYSTAL DEVICES

(71) Applicant: Wuhan China Star Optoelectronics Technology Co., Ltd., Wuhan, Hubei (CN)

(72) Inventor: Guangbao Fan, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 137 days.

(21) Appl. No.: 15/107,322

(22) PCT Filed: May 26, 2016

(86) PCT No.: PCT/CN2016/083558
§ 371 (c)(1),
(2) Date: Jun. 22, 2016

(87) PCT Pub. No.: WO2017/128574
PCT Pub. Date: Aug. 3, 2017

(65) Prior Publication Data
US 2018/0046001 A1    Feb. 15, 2018

(30) Foreign Application Priority Data
Jan. 29, 2016  (CN) .......................... 2016 1 0063973

(51) Int. Cl.
*G02F 1/1343* (2006.01)
*G02F 1/1335* (2006.01)
(Continued)

(52) U.S. Cl.
CPC ...... *G02F 1/1334* (2013.01); *G02F 1/136209* (2013.01); *H01L 27/1214* (2013.01);
(Continued)

(58) Field of Classification Search
CPC ....... G02F 1/1343; G02F 2001/134372; G02F 1/134363; G02F 1/133514; G02F 1/133512
See application file for complete search history.

(56) References Cited

U.S. PATENT DOCUMENTS

2004/0189914 A1 * 9/2004 Matsuyama ........ G02F 1/13394
349/129
2008/0074602 A1 * 3/2008 Arai .................. G02F 1/134363
349/146
(Continued)

FOREIGN PATENT DOCUMENTS

| CN | 101526704 A | 9/2009 |
|---|---|---|
| CN | 104280931 A | 1/2015 |

(Continued)

*Primary Examiner* — Jia Pan
(74) *Attorney, Agent, or Firm* — Andrew C. Cheng

(57) ABSTRACT

The present invention discloses a liquid crystal panel and a liquid crystal device (LCD). The liquid crystal panel includes a color-film (CF) substrate and a thin film transistor (TFT) array substrate opposite to the CF substrate. The CF substrate and the TFT array substrate are spaced apart from each other. The CF substrate includes a first substrate, a plurality of photo-resist units, and a plurality of masking units. The photo-resist units and the masking units are arranged on a surface of the first substrate adjacent to the TFT array substrate. The photo-resist units are spaced apart from each other, and the masking unit is configured between the adjacent photo-resist units. The TFT array substrate includes a second substrate and a plurality of first transparent electrode units.

18 Claims, 7 Drawing Sheets

(51) Int. Cl.
*G02F 1/1334* (2006.01)
*H01L 27/12* (2006.01)
*G02F 1/1362* (2006.01)

(52) U.S. Cl.
CPC .. *G02F 1/133512* (2013.01); *G02F 1/133514* (2013.01); *G02F 1/134363* (2013.01); *G02F 2001/134372* (2013.01)

(56) References Cited

U.S. PATENT DOCUMENTS

| | | | |
|---|---|---|---|
| 2009/0147162 A1* | 6/2009 | Yeom | G02F 1/133707 349/33 |
| 2015/0362776 A1* | 12/2015 | Jikumaru | H01L 27/124 349/12 |
| 2016/0147093 A1* | 5/2016 | Zhong | G02F 1/133707 349/43 |

FOREIGN PATENT DOCUMENTS

| | | |
|---|---|---|
| CN | 105527762 A | 4/2016 |
| JP | 2000111725 A | 4/2000 |
| JP | 2008116528 A | 5/2008 |

* cited by examiner

LIQUID CRYSTAL PANELS AND LIQUID CRYSTAL DEVICES

CROSS REFERENCE

This application claims the priority of Chinese Patent Application No. 201610063973.9, entitled "Liquid crystal panels and liquid crystal devices", filed on Jan. 29, 2016, the disclosure of which is incorporated herein by reference in its entirety.

FIELD OF THE INVENTION

The present invention relates to display field, and more particularly to a liquid crystal panel and a liquid crystal device (LCD).

BACKGROUND OF THE INVENTION

LCDs have been common display devices characterized by attributes such as, low power consumption, small dimension, and light weight. A LCD generally includes a liquid crystal panel having a color film (CF) substrate and a thin film transistor (TFT) substrate opposite to the CF substrate. The CF substrate and the TFT substrate are spaced apart from each other. A surface of a transparent conductive unit, such as a pixel electrode and a common electrode, within the TFT substrate is usually planar. In addition, two ends of the transparent conductive unit correspond to black matrixes (BMs) at lateral sides of the CF substrate. Thus, the light beams passing through two ends of the transparent conductive unit cannot pass through the BMs, which results in a lower optical utilization of the liquid crystal panel.

SUMMARY OF THE INVENTION

The technical issue that the embodiment of the present invention solves is to provide a flat panel and flat panel display, achieving the resolution increase of the flat panel display in the same area.

In one aspect, a liquid crystal panel includes: a color-film (CF) substrate and a thin film transistor (TFT) array substrate opposite to the CF substrate, the CF substrate and the TFT array substrate are spaced apart from each other, the CF substrate includes a first substrate, a plurality of photo-resist units, and a plurality of masking units, the photo-resist units and the masking units are arranged on a surface of the first substrate adjacent to the TFT array substrate, the photo-resist units are spaced apart from each other, and the masking unit is configured between the adjacent photo-resist units, the TFT array substrate includes a second substrate and a plurality of first transparent electrode units, the first transparent electrode units are arranged on a surface of the second substrate adjacent to the CF substrate, and the first transparent electrode units are spaced apart from each other, each of the first transparent electrode units faces toward one photo-resist unit, a dimension of the first transparent electrode units with respect to the first direction is greater than the dimension of the corresponding photo-resist units with respect to the first direction, one surface of the first transparent electrode units facing away the second substrate is a concave curved surface, wherein the first direction is parallel to the direction of the second substrate.

Wherein the first transparent electrode unit includes a first portion, a second portion, and a third portion integrally formed along the first direction, the first portion includes a first end and a second end on the surface facing away the second substrate, and the first end is opposite to the second end, the first end is farther away from the second portion than the second end, a gap between the surface of the first portion facing away the second substrate and the second substrate is linearly decreased along a direction from the first end toward the second end; the second portion includes a third end and a fourth end on the surface facing away the second substrate, and the third end is opposite to the fourth end, the third end is closer to the first portion than the fourth end, the fourth end is closer to the third portion than the third end, gaps between the surface of the second portion facing away the second substrate and the second substrate is the same along the direction from the third end to the fourth end; The third portion includes a fifth end and a sixth end on the surface facing away the second substrate, and the fifth end is opposite to the sixth end, the fifth end is closer to the second portion than the sixth end, a gap between the surface of the third portion facing away the second substrate and the second substrate is linearly increased along a direction from the fifth end toward the sixth end.

Wherein the first portion is symmetrical to the third portion with respect to the second portion.

Wherein the first transparent electrode unit includes a first portion, a second portion, and a third portion integrally formed along the first direction, and the surface of the first portion facing away the second substrate, the surface of the second portion facing away the second substrate, and the surface of the third portion facing away the second substrate constitute an arc-surface.

Wherein the first transparent electrode unit includes a first portion, a second portion, and a third portion integrally formed along the first direction, the first portion includes a first end and a second end on the surface facing away the second substrate, and the first end is opposite to the second end, the first end is farther away from the second portion than the second end, a gap between the surface of the first portion facing away the second substrate and the second substrate is linearly decreased along a direction from the first end toward the second end; the second portion includes a third end and a fourth end on the surface facing away the second substrate, and the third end is opposite to the fourth end, the third end is closer to the first portion than the fourth end, the fourth end is closer to the third portion than the third end, the surface of the second portion facing away the second substrate is an arc-surface; and the third portion includes a fifth end and a sixth end on the surface facing away the second substrate, and the fifth end is opposite to the sixth end, the fifth end is closer to the second portion than the sixth end, a gap between the surface of the third portion facing away the second substrate and the second substrate is linearly increased along a direction from the fifth end toward the sixth end.

Wherein the first transparent electrode unit includes a first portion, a second portion, and a third portion integrally formed along the first direction, the first portion includes a first end and a second end on the surface facing away the second substrate, and the first end is opposite to the second end, the first end is farther away from the second portion than the second end, the surface of the first portion facing away the second substrate is an arc-surface, a gap between the surface of the first portion facing away the second substrate and the second substrate is linearly decreased along a direction from the first end toward the second end; the second portion includes a third end and a fourth end on the surface facing away the second substrate, and the third end is opposite to the fourth end, the third end is closer to the first portion than the fourth end, the fourth end is closer to the third portion than the third end, gaps between the surfaces of the second portion facing away the second substrate are the same along the direction from the third end to the fourth end; and the third portion includes a fifth end and a sixth end on the surface facing away the second substrate, and the fifth end is opposite to the sixth end, the fifth end is closer to the second portion than the sixth end, the surface of the third portion facing away the second substrate is the arc-surface, a gap between the surface of the third portion facing away the second substrate and the second substrate is linearly increased along a direction from the fifth end toward the sixth end.

Wherein the TFT array substrate further includes a plurality of second transparent electrode units, the second transparent electrode units are closer to the CF substrate than the first transparent electrode units, the second transparent electrode units are insulated from the first transparent electrode units, the first transparent electrode units are configured to receive a first voltage, and the second transparent electrode units are configured to receive a second voltage, the second voltage loaded on the second transparent electrode units cooperates with the second voltage loaded on the first transparent electrode units to control alignment of the liquid crystal molecules, and the liquid crystal molecules are arranged between the CF substrate and the TFT array substrate.

Wherein the first transparent electrode unit is a pixel electrode, and the second transparent electrode unit is a common electrode, or the first transparent electrode units is the common electrode, and the second transparent electrode units is the pixel electrode.

Wherein the photo-resist units include red photo-resist units, green photo-resist units, and blue photo-resist units arranged periodically on the second substrate in accordance with a predetermined sequence.

In another aspect, a LCD includes the liquid crystal panel in the above embodiments.

In view of the above, one surface of the first transparent electrode units facing away the second substrate is a concave curved surface. When the light beams enter the second substrate and emit out via the first transparent electrode units, the light beams from two ends of the first transparent electrode units are reflected into the photo-resist units. Conventionally, the light beams passing through two ends of the transparent electrode unit cannot pass through the black matrix, and thus the optical utilization of the liquid crystal panel is low. With such configuration, such issue may be overcome. Thus, the optical utilization of the liquid crystal panel is high, which increases the displayed brightness of the liquid crystal panel.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
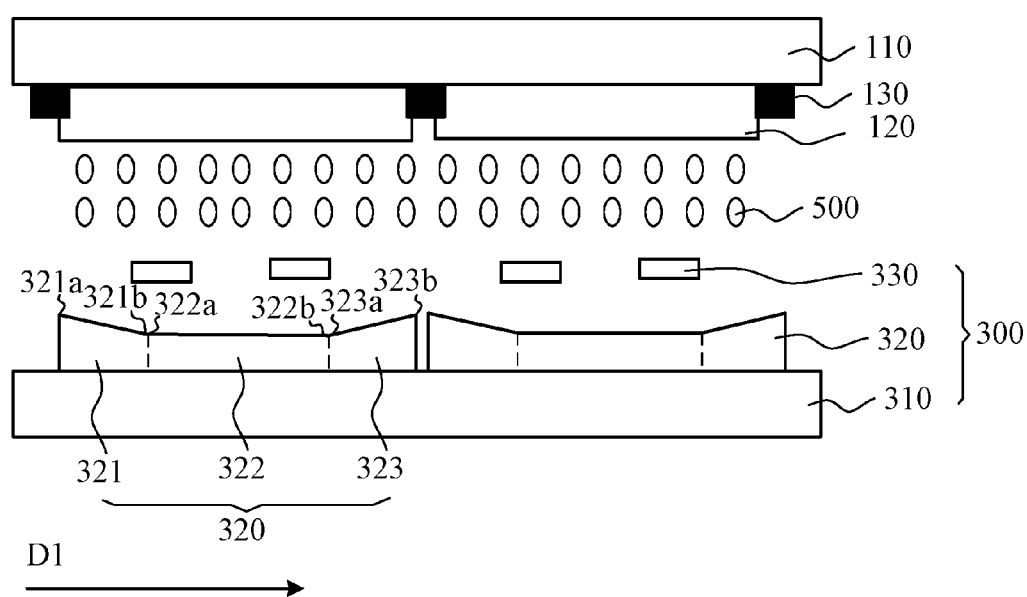
FIG. 1 is a cross sectional view of the liquid crystal panel in accordance with a first embodiment.

FIG. 1 is a cross sectional view of the liquid crystal panel in accordance with a first embodiment. The display panel 10 includes a CF substrate 100 and a TFT array substrate 300. The CF substrate 100 includes a first substrate 110, a plurality of photo-resist units 120, and a plurality of masking units 130. The photo-resist units 120 and the masking units 130 are arranged on a surface of the first substrate 110 adjacent to the TFT array substrate 300. The photo-resist units 120 are spaced apart from each other, and the masking unit 130 is configured between the adjacent photo-resist units 120. The TFT array substrate 300 includes a second substrate 310 and a plurality of first transparent electrode units 320. The first transparent electrode units 320 are arranged on a surface of the second substrate 310 adjacent to the CF substrate 100, and the first transparent electrode units 320 are spaced apart from each other. Each of the first transparent electrode units 320 faces toward one photo-resist unit 120. A dimension of the first transparent electrode units 320 with respect to the first direction (D1) is greater than the dimension of the corresponding photo-resist units 120 with respect to the first direction (D1). In addition, one surface of the first transparent electrode units 320 facing away the second substrate 310 is a concave curved surface, wherein the first direction (D1) is parallel to the direction of the second substrate 310. In the embodiment, the masking units 130 are black matrixes to avoid mixed light and to prevent light transmission.

Each of the first transparent electrode unit 320 includes a first portion 321, a second portion 322, and a third portion 323 connected together.

The first portion 321 includes a first end 321*a* and a second end 321*b* on the surface facing away the second substrate 310, and the first end 321*a* is opposite to the second end 321*b*. The first end 321*a* is farther away from the second portion 322 than the second end 321*b*. A gap between the surface of the first portion 321 facing away the second substrate 310 and the second substrate 310 is linearly decreased along a direction from the first end 321*a* toward the second end 321*b*.

The second portion 322 includes a third end 322*a* and a fourth end 322*b* on the surface facing away the second substrate 310, and the third end 322*a* is opposite to the 322*b* is opposite to the 322b. The third end 322a is closer to the first portion 321 than the fourth end 322b. In addition, the fourth end 322b is closer to the third portion 323 than the third end 322a. The gap between the surface of the second portion 322 facing away the second substrate 310 and the second substrate 310 is the same along the direction from the third end 322a to the fourth end 322b. That is, the surface of the second portion 322 facing away the second substrate 310 is a plane.

The third portion 323 includes a fifth end 323a and a sixth end 323b on the surface facing away the second substrate 310, and the fifth end 323a is opposite to the sixth end 323b. The fifth end 323a is closer to the second portion 322 than the sixth end 323b. In addition, a gap between the surface of the third portion 323 facing away the second substrate 310 and the second substrate 310 is linearly increased along a direction from the fifth end 323a toward the sixth end 323b.

Preferably, the first portion 321 is symmetrical to the third portion 323 with respect to the second portion 322. It can be understood that, in other embodiments, the first portion 321 may be asymmetrical to the third portion 323 with respect to the second portion 322.

In one embodiment, the photo-resist units 120 include red photo-resist units, green photo-resist units, and blue photo-resist units arranged periodically on the second substrate 310 in accordance with a predetermined sequence. For instance, within the same pixel, the predetermined sequence along the first direction (D1) is the red photo-resist unit, the green photo-resist unit, and the blue photo-resist unit.

The TFT array substrate 300 further includes a plurality of second transparent electrode units 330. The second transparent electrode units 330 are closer to the CF substrate 100 than the first transparent electrode units 320. In addition, the second transparent electrode units 330 are insulated from the first transparent electrode units 320. The first transparent electrode units 320 are configured to receive a first voltage, and the second transparent electrode units 330 are configured to receive a second voltage. The second voltage loaded on the second transparent electrode units 330 cooperates with the second voltage loaded on the first transparent electrode units 320 to control the alignment of the liquid crystal molecules 500. The liquid crystal molecules are arranged between the CF substrate 100 and the TFT array substrate 300. In the embodiment, each of the first transparent electrode units 320 corresponds to two second transparent electrode units 330. The two second transparent electrode units 330 corresponding to one first transparent electrode units 320 are spaced apart from each other. In addition, the two second transparent electrode units 330 correspond to a middle of the first transparent electrode units 320.

In one embodiment, the first transparent electrode unit 320 is a pixel electrode, and the second transparent electrode unit 330 is a common electrode. In another embodiment, the first transparent electrode units 320 is the common electrode, and the second transparent electrode units 330 is the pixel electrode.

Figure 2:
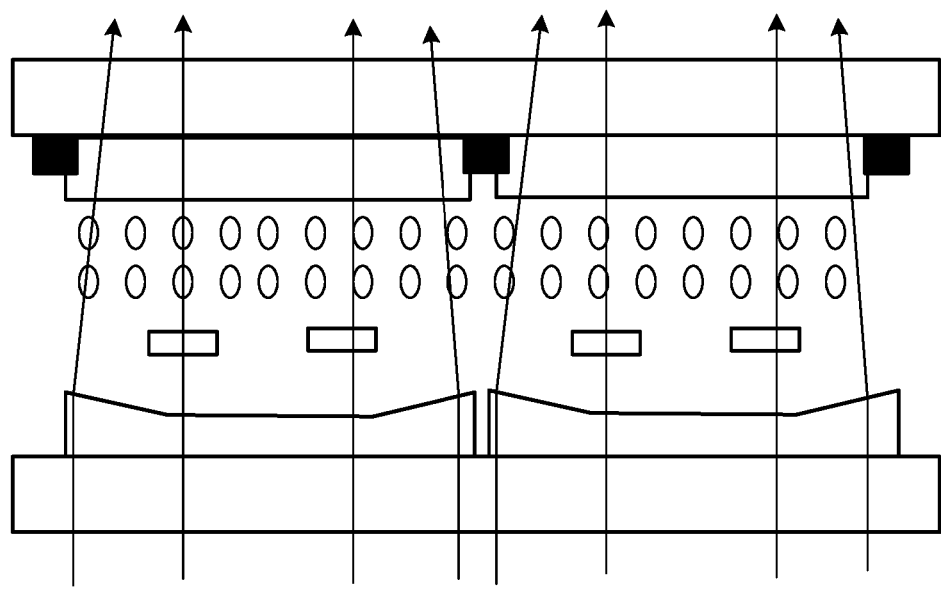
FIG. 2 is a schematic view showing that the light beams are emitted out from a surface of the second substrate facing away the CF substrate, enter the second substrate, and are emitted out from the first transparent electrode unit.

In view of the above, one surface of the first transparent electrode units 320 facing away the second substrate 310 is a concave curved surface. When the light beams enter the second substrate 310 and emit out via the first transparent electrode units 320, the light beams from two ends of the first transparent electrode units 320 are reflected into the photo-resist units 120. Conventionally, the light beams passing through two ends of the transparent electrode unit cannot pass through the black matrix, and thus the optical utilization of the liquid crystal panel is low. However, in view of FIG. 2, such problem may be solved with such configuration. Thus, the optical utilization of the liquid crystal panel 10 is high, which increases the displayed brightness of the liquid crystal panel 10.

Further, one surface of the first transparent electrode units 320 facing away the second substrate 310 is a concave curved surface. When the light beams emitting from the surface of the CF substrate 100 enter the second substrate 310, and emit out from the first transparent electrode units 320, the light beams from two ends of the first transparent electrode units 320 are reflected into the photo-resist units 120 such that the brightness of the rim of the photo-resist units 120 is greater than the brightness of the internal of the photo-resist units 120. Thus, the photo-resist units 120 including the red photo-resist units, the green photo-resist units, and the blue photo-resist unit not only increases the brightness between the above photo-resist units, but also increases the gamut of the three colors.

Figure 3:
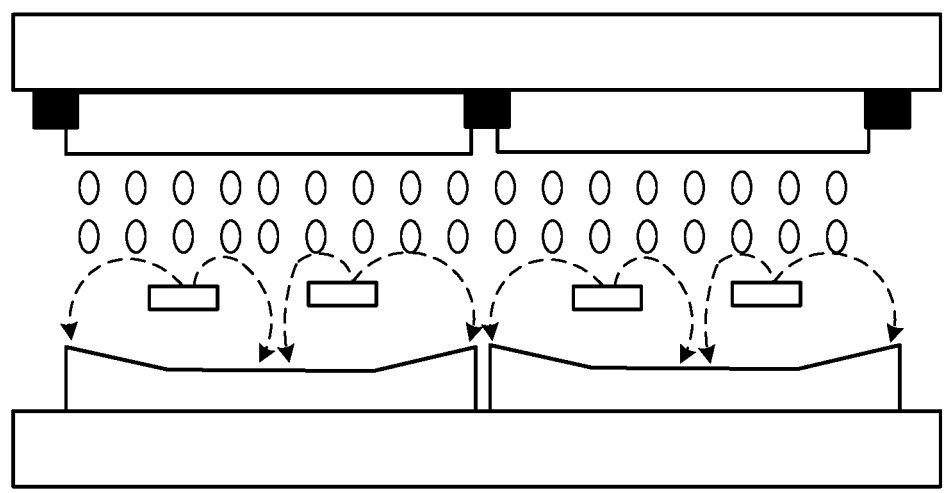
FIG. 3 is a schematic view showing the electrical fields distributed between the first transparent electrode unit and the second transparent electrode unit.

Further, as one surface of the first transparent electrode units 320 facing away the second substrate 310 is a concave curved surface, the electrical fields between the first transparent electrode units 320 and the corresponding second transparent electrode units 330 are blocked by two protrusion portions at two ends of the first transparent electrode units 320. Referring to FIG. 3, the impact toward the pixel in a rim has been decreased, which reduces the crosstalk issue.

Figure 4:
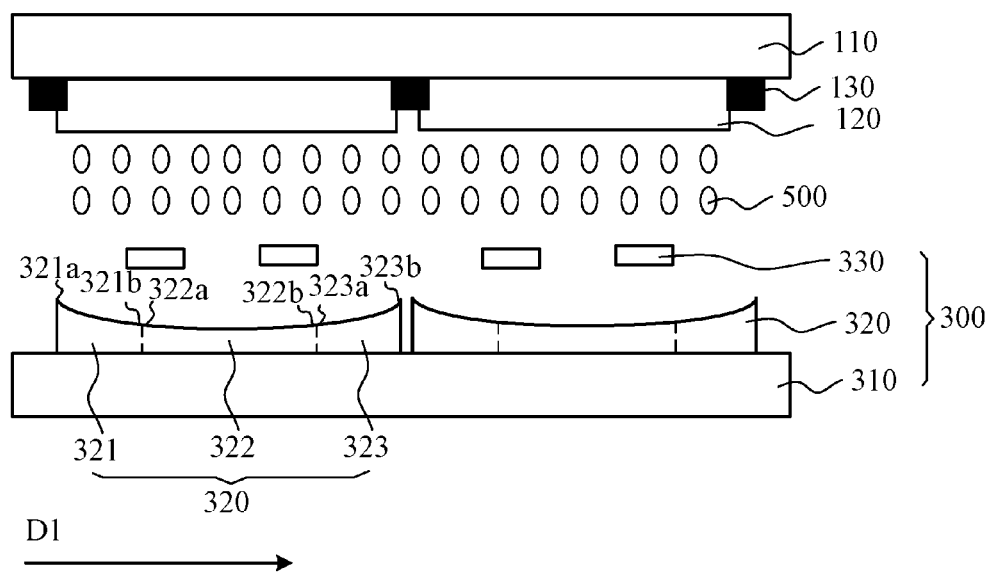
FIG. 4 is a cross sectional view of the liquid crystal panel in accordance with a second embodiment.

FIG. 4 is a cross sectional view of the liquid crystal panel in accordance with a second embodiment. The difference between the second embodiment and the first embodiment will be discussed below. In the embodiment, each of the first transparent electrode unit 320 includes a first portion 321, a second portion 322, and a third portion 323 integrally formed along the first direction (D1). The surface of the first portion 321 facing away the second substrate 310, the surface of the second portion 322 facing away the second substrate 310, and the surface of the third portion 323 facing away the second substrate 310 constitute an arc-surface.

Figure 5:
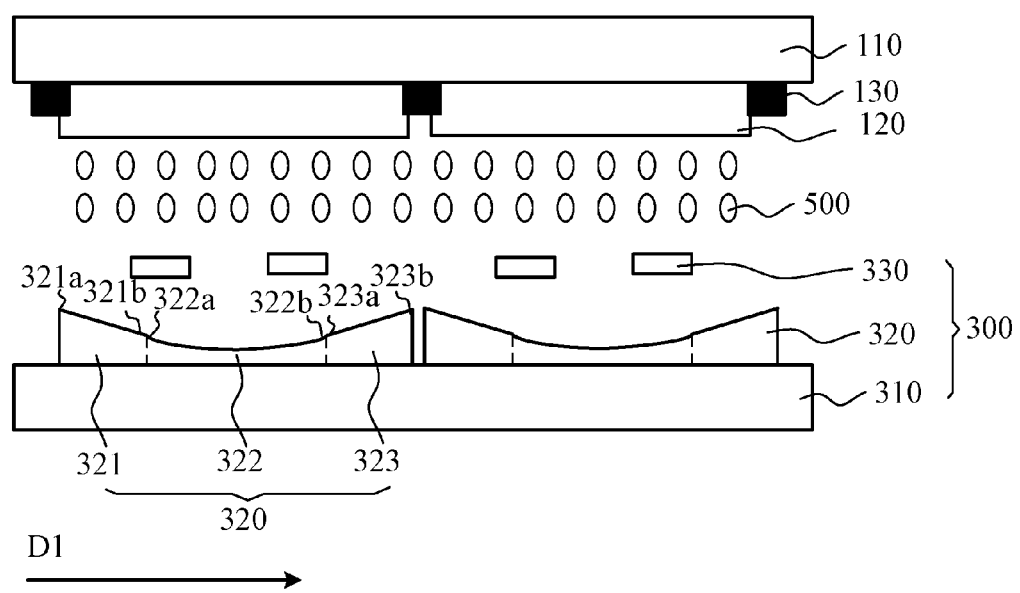
FIG. 5 is a cross sectional view of the liquid crystal panel in accordance with a third embodiment.

FIG. 5 is a cross sectional view of the liquid crystal panel in accordance with a third embodiment. The difference between the third embodiment and the first embodiment will be discussed below.

In the embodiment, each of the first transparent electrode unit 320 includes a first portion 321, a second portion 322, and a third portion 323 integrally formed along the first direction (D1).

The first portion 321 includes a first end 321a and a second end 321b on the surface facing away the second substrate 310, and the first end 321a is opposite to the second end 321b. The first end 321a is farther away from the second portion 322 than the second end 321b. A gap between the surface of the first portion 321 facing away the second substrate 310 and the second substrate 310 is linearly decreased along a direction from the first end 321a toward the second end 321b.

The second portion 322 includes a third end 322a and a fourth end 322b on the surface facing away the second substrate 310, and the third end 322a is opposite to the 322b is opposite to the 322b. The third end 322a is closer to the first portion 321 than the fourth end 322b. In addition, the fourth end 322b is closer to the third portion 323 than the third end 322a. The surface of the second portion 322 facing away the second substrate 310 is an arc-surface.

The third portion 323 includes a fifth end 323a and a sixth end 323b on the surface facing away the second substrate 310, and the fifth end 323a is opposite to the sixth end 323b. The fifth end 323a is closer to the second portion 322 than the sixth end 323*b*. In addition, a gap between the surface of the third portion 323 facing away the second substrate 310 and the second substrate 310 is linearly increased along a direction from the fifth end 323*a* toward the sixth end 323*b*.

Figure 6:
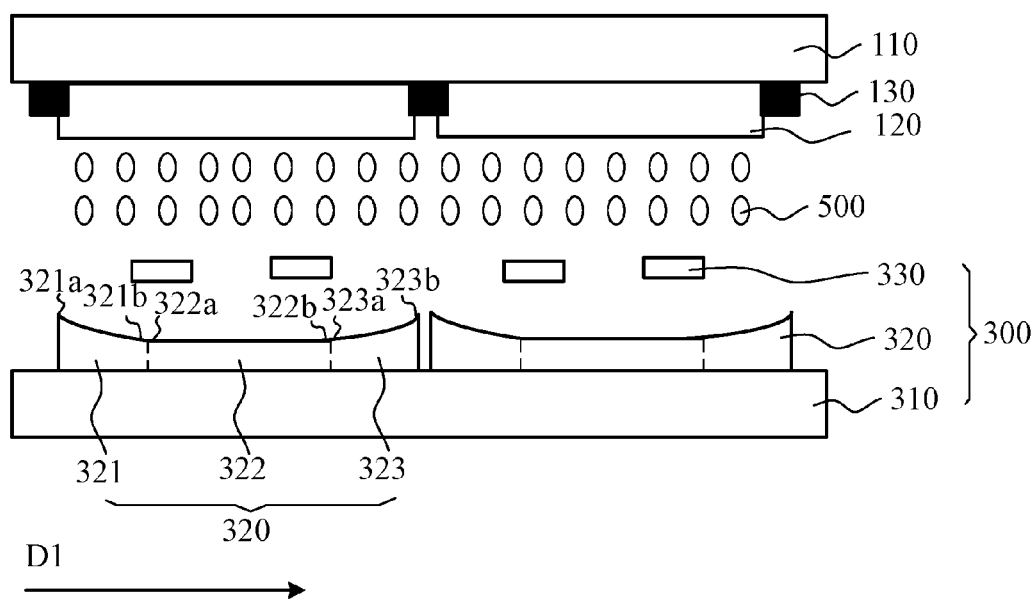
FIG. 6 is a cross sectional view of the liquid crystal panel in accordance with a fourth embodiment.

FIG. 6 is a cross sectional view of the liquid crystal panel in accordance with a fourth embodiment. The difference between the fourth embodiment and the first embodiment will be discussed below. In the embodiment, each of the first transparent electrode unit 320 includes a first portion 321, a second portion 322, and a third portion 323 integrally formed along the first direction (D1).

The first portion 321 includes a first end 321*a* and a second end 321*b* on the surface facing away the second substrate 310, and the first end 321*a* is opposite to the second end 321*b*. The first end 321*a* is farther away from the second portion 322 than the second end 321*b*. The surface of the first portion 321 facing away the second substrate 310 is an arc-surface. A gap between the surface of the first portion 321 facing away the second substrate 310 and the second substrate 310 is linearly decreased along a direction from the first end 321*a* toward the second end 321*b*.

The second portion 322 includes a third end 322*a* and a fourth end 322*b* on the surface facing away the second substrate 310, and the third end 322*a* is opposite to the 322*b* is opposite to the 322*b*. The third end 322*a* is closer to the first portion 321 than the fourth end 322*b*. In addition, the fourth end 322*b* is closer to the third portion 323 than the third end 322*a*. Gaps between the surfaces of the second portion 322 facing away the second substrate 310 are the same along the direction from the third end 322*a* to the fourth end 322*b*.

The third portion 323 includes a fifth end 323*a* and a sixth end 323*b* on the surface facing away the second substrate 310, and the fifth end 323*a* is opposite to the sixth end 323*b*. The fifth end 323*a* is closer to the second portion 322 than the sixth end 323*b*. The surface of the third portion 323 facing away the second substrate 310 is the arc-surface. In addition, a gap between the surface of the third portion 323 facing away the second substrate 310 and the second substrate 310 is linearly increased along a direction from the fifth end 323*a* toward the sixth end 323*b*.

Figure 7:
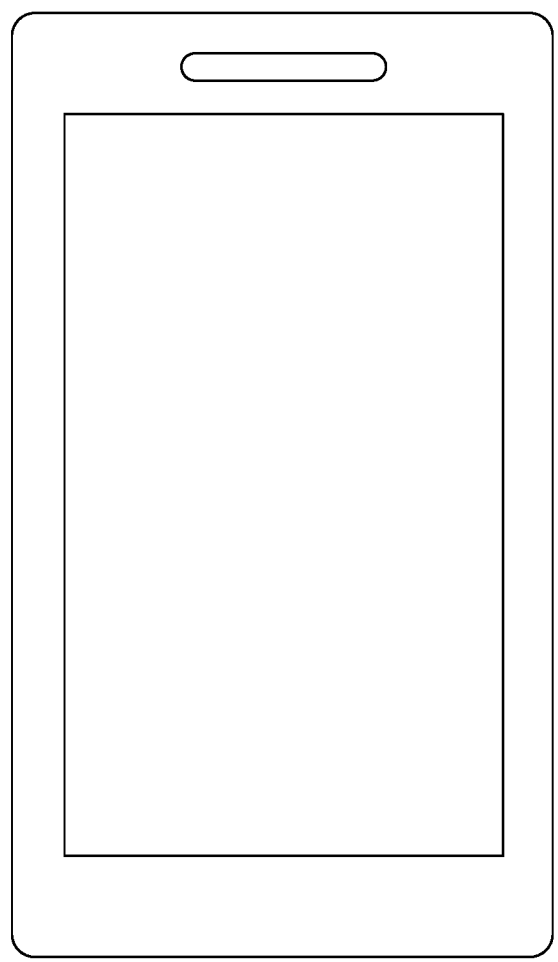
FIG. 7 is a schematic view of the LCD in accordance with one embodiment.

FIG. 7 is a schematic view of the LCD in accordance with one embodiment. The LCD 1 includes the liquid crystal panel 10 in the above embodiments. The display device 1 may be, but not limited to, Mobile Internet Device (MID), e-books, Play Station Portable (PSP) or Personal Digital Assistant (PDA). The display device 1 may be a LCD.

Above are embodiments of the present invention, which does not limit the scope of the present invention. Any modifications, equivalent replacements or improvements within the spirit and principles of the embodiment described above should be covered by the protected scope of the invention.

What is claimed is:

1. A liquid crystal panel, comprising:
a color-film (CF) substrate and a thin film transistor (TFT) array substrate opposite to the CF substrate, the CF substrate and the TFT array substrate are spaced apart from each other, the CF substrate comprises a first substrate, a plurality of photo-resist units, and a plurality of masking units, the photo-resist units and the masking units are arranged on a surface of the first substrate adjacent to the TFT array substrate, the photo-resist units are spaced apart from each other, and the masking unit is configured between the adjacent photo-resist units, the TFT array substrate comprises a second substrate and a plurality of first transparent electrode units, the first transparent electrode units are arranged on a surface of the second substrate adjacent to the CF substrate, and the first transparent electrode units are spaced apart from each other, each of the first transparent electrode units faces toward a corresponding photo-resist unit respectively, a dimension of each of the first transparent electrode units with respect to a first direction is greater than a dimension of the corresponding photo-resist unite with respect to the first direction, a surface of each of the first transparent electrode units facing away the second substrate is a concave curved surface, wherein the first direction is parallel to an edge of the second substrate, and wherein the TFT array substrate further comprises a plurality of second transparent electrode units, the second transparent electrode units are closer to the CF substrate than the first transparent electrode units, the second transparent electrode units are insulated from the first transparent electrode units.

2. The liquid crystal panel as claimed in claim 1, wherein the first transparent electrode unit comprises a first portion, a second portion, and a third portion integrally formed along the first direction, the first portion comprises a first end and a second end on the surface facing away the second substrate, and the first end is opposite to the second end, the first end is farther away from the second portion than the second end, a gap between the surface of the first portion facing away the second substrate and the second substrate is linearly decreased along a direction from the first end toward the second end;

the second portion comprises a third end and a fourth end on the surface facing away the second substrate, and the third end is opposite to the fourth end, the third end is closer to the first portion than the fourth end, the fourth end is closer to the third portion than the third end, gaps between the surface of the second portion facing away the second substrate and the second substrate is the same along a direction from the third end to the fourth end;

the third portion comprises a fifth end and a sixth end on the surface facing away the second substrate, and the fifth end is opposite to the sixth end, the fifth end is closer to the second portion than the sixth end, a gap between the surface of the third portion facing away the second substrate and the second substrate is linearly increased along a direction from the fifth end toward the sixth end.

3. The liquid crystal panel as claimed in claim 2, wherein the first portion is symmetrical to the third portion with respect to the second portion.

4. The liquid crystal panel as claimed in claim 1, wherein the first transparent electrode unit comprises a first portion, a second portion, and a third portion integrally formed along the first direction, and the surface of the first portion facing away the second substrate, the surface of the second portion facing away the second substrate, and the surface of the third portion facing away the second substrate constitute an arc-surface.

5. The liquid crystal panel as claimed in claim 1, wherein the first transparent electrode unit comprises a first portion, a second portion, and a third portion integrally formed along the first direction, the first portion comprises a first end and a second end on the surface facing away the second substrate, and the first end is opposite to the second end, the first end is farther away from the second portion than the second end, a gap between the surface of the first portion facing away the second substrate and the second substrate is linearly decreased along a direction from the first end toward the second end;

the second portion comprises a third end and a fourth end on the surface facing away the second substrate, and the third end is opposite to the fourth end, the third end is closer to the first portion than the fourth end, the fourth end is closer to the third portion than the third end, the surface of the second portion facing away the second substrate is an arc-surface; and the third portion comprises a fifth end and a sixth end on the surface facing away the second substrate, and the fifth end is opposite to the sixth end, the fifth end is closer to the second portion than the sixth end, a gap between the surface of the third portion facing away the second substrate and the second substrate is linearly increased along a direction from the fifth end toward the sixth end.

6. The liquid crystal panel as claimed in claim 1, wherein the first transparent electrode unit comprises a first portion, a second portion, and a third portion integrally formed along the first direction, the first portion comprises a first end and a second end on the surface facing away the second substrate, and the first end is opposite to the second end, the first end is farther away from the second portion than the second end, the surface of the first portion facing away the second substrate is an arc-surface, a gap between the surface of the first portion facing away the second substrate and the second substrate is linearly decreased along a direction from the first end toward the second end;

the second portion comprises a third end and a fourth end on the surface facing away the second substrate, and the third end is opposite to the fourth end, the third end is closer to the first portion than the fourth end, the fourth end is closer to the third portion than the third end, gaps between the surfaces of the second portion facing away the second substrate are the same along the direction from the third end to the fourth end; and the third portion comprises a fifth end and a sixth end on the surface facing away the second substrate, and the fifth end is opposite to the sixth end, the fifth end is closer to the second portion than the sixth end, the surface of the third portion facing away the second substrate is the arc-surface, a gap between the surface of the third portion facing away the second substrate and the second substrate is linearly increased along a direction from the fifth end toward the sixth end.

7. The liquid crystal panel as claimed in claim 1, wherein the first transparent electrode units are configured to receive a first voltage, and the second transparent electrode units are configured to receive a second voltage, the second voltage loaded on the second transparent electrode units cooperates with the first voltage loaded on the first transparent electrode units to control alignment of the liquid crystal molecules, and the liquid crystal molecules are arranged between the CF substrate and the TFT array substrate.

8. The liquid crystal panel as claimed in claim 7, wherein the first transparent electrode unit is a pixel electrode, and the second transparent electrode unit is a common electrode, or the first transparent electrode units is the common electrode, and the second transparent electrode units is the pixel electrode.

9. The liquid crystal panel as claimed in claim 7, wherein the photo-resist units comprises red photo-resist units, green photo-resist units, and blue photo-resist units arranged periodically on the second substrate in accordance with a predetermined sequence.

10. A liquid crystal device (LCD), comprising:
a liquid crystal panel comprising a color-film (CF) substrate and a thin film transistor (TFT) array substrate opposite to the CF substrate, the CF substrate and the TFT array substrate are spaced apart from each other, the CF substrate comprises a first substrate, a plurality of photo-resist units, and a plurality of masking units, the photo-resist units and the masking units are arranged on a surface of the first substrate adjacent to the TFT array substrate, the photo-resist units are spaced apart from each other, and the masking unit is configured between the adjacent photo-resist units, the TFT array substrate comprises a second substrate and a plurality of first transparent electrode units, the first transparent electrode units are arranged on a surface of the second substrate adjacent to the CF substrate, and the first transparent electrode units are spaced apart from each other, each of the first transparent electrode units faces toward a corresponding photo-resist unit respectively, a dimension of each of the first transparent electrode units with respect to a first direction is greater than a dimension of the corresponding photo-resist unite with respect to the first direction, a surface of each of the first transparent electrode units facing away the second substrate is a concave curved surface, wherein the first direction is parallel to an edge of the second substrate, and wherein the TFT array substrate further comprises a plurality of second transparent electrode units, the second transparent electrode units are closer to the CF substrate than the first transparent electrode units, the second transparent electrode units are insulated from the first transparent electrode units.

11. The LCD as claimed in claim 10, wherein the first transparent electrode unit comprises a first portion, a second portion, and a third portion integrally formed along the first direction, the first portion comprises a first end and a second end on the surface facing away the second substrate, and the first end is opposite to the second end, the first end is farther away from the second portion than the second end, a gap between the surface of the first portion facing away the second substrate and the second substrate is linearly decreased along a direction from the first end toward the second end;

the second portion comprises a third end and a fourth end on the surface facing away the second substrate, and the third end is opposite to the fourth end, the third end is closer to the first portion than the fourth end, the fourth end is closer to the third portion than the third end, gaps between the surface of the second portion facing away the second substrate and the second substrate is the same along a direction from the third end to the fourth end;

the third portion comprises a fifth end and a sixth end on the surface facing away the second substrate, and the fifth end is opposite to the sixth end, the fifth end is closer to the second portion than the sixth end, a gap between the surface of the third portion facing away the second substrate and the second substrate is linearly increased along a direction from the fifth end toward the sixth end.

12. The LCD as claimed in claim 11, wherein the first portion is symmetrical to the third portion with respect to the second portion.

13. The liquid crystal panel as claimed in claim 10, wherein the first transparent electrode unit comprises a first portion, a second portion, and a third portion integrally formed along the first direction, and the surface of the first portion facing away the second substrate, the surface of the second portion facing away the second substrate, and the surface of the third portion facing away the second substrate constitute an arc-surface.

14. The liquid crystal panel as claimed in claim 10, wherein the first transparent electrode unit comprises a first portion, a second portion, and a third portion integrally formed along the first direction, the first portion comprises a first end and a second end on the surface facing away the second substrate, and the first end is opposite to the second end, the first end is farther away from the second portion than the second end, a gap between the surface of the first portion facing away the second substrate and the second substrate is linearly decreased along a direction from the first end toward the second end;

the second portion comprises a third end and a fourth end on the surface facing away the second substrate, and the third end is opposite to the fourth end, the third end is closer to the first portion than the fourth end, the fourth end is closer to the third portion than the third end, the surface of the second portion facing away the second substrate is an arc-surface; and the third portion comprises a fifth end and a sixth end on the surface facing away the second substrate, and the fifth end is opposite to the sixth end, the fifth end is closer to the second portion than the sixth end, a gap between the surface of the third portion facing away the second substrate and the second substrate is linearly increased along a direction from the fifth end toward the sixth end.

15. The liquid crystal panel as claimed in claim 10, wherein the first transparent electrode unit comprises a first portion, a second portion, and a third portion integrally formed along the first direction, the first portion comprises a first end and a second end on the surface facing away the second substrate, and the first end is opposite to the second end, the first end is farther away from the second portion than the second end, the surface of the first portion facing away the second substrate is an arc-surface, a gap between the surface of the first portion facing away the second substrate and the second substrate is linearly decreased along a direction from the first end toward the second end;

the second portion comprises a third end and a fourth end on the surface facing away the second substrate, and the third end is opposite to the fourth end, the third end is closer to the first portion than the fourth end, the fourth end is closer to the third portion than the third end, gaps between the surfaces of the second portion facing away the second substrate are the same along the direction from the third end to the fourth end; and the third portion comprises a fifth end and a sixth end on the surface facing away the second substrate, and the fifth end is opposite to the sixth end, the fifth end is closer to the second portion than the sixth end, the surface of the third portion facing away the second substrate is the arc-surface, a gap between the surface of the third portion facing away the second substrate and the second substrate is linearly increased along a direction from the fifth end toward the sixth end.

16. The liquid crystal panel as claimed in claim 10, wherein the first transparent electrode units are configured to receive a first voltage, and the second transparent electrode units are configured to receive a second voltage, the second voltage loaded on the second transparent electrode units cooperates with the first voltage loaded on the first transparent electrode units to control alignment of the liquid crystal molecules, and the liquid crystal molecules are arranged between the CF substrate and the TFT array substrate.

17. The LCD as claimed in claim 16, wherein the first transparent electrode unit is a pixel electrode, and the second transparent electrode unit is a common electrode, or the first transparent electrode units is the common electrode, and the second transparent electrode units is the pixel electrode.

18. The LCD as claimed in claim 16, wherein the photo-resist units comprises red photo-resist units, green photo-resist units, and blue photo-resist units arranged periodically on the second substrate in accordance with a predetermined sequence.

* * * * *